United States Patent
Weimer et al.

(10) Patent No.: US 11,753,717 B2
(45) Date of Patent: Sep. 12, 2023

(54) STABILITY OF REFRACTORY MATERIALS IN HIGH TEMPERATURE STEAM

(71) Applicant: The Regents of the University of Colorado, Denver, CO (US)

(72) Inventors: Alan W. Weimer, Niwot, CO (US); Amanda Hoskins, Superior, CO (US); Charles Musgrove, Longmont, CO (US)

(73) Assignee: The Regents of the University of Colorado, Denver, CO (US)

( * ) Notice: Subject to any disclaimer, the term of this patent is extended or adjusted under 35 U.S.C. 154(b) by 1027 days.

(21) Appl. No.: 16/348,980

(22) PCT Filed: Nov. 10, 2017

(86) PCT No.: PCT/US2017/061021
§ 371 (c)(1),
(2) Date: May 10, 2019

(87) PCT Pub. No.: WO2018/089745
PCT Pub. Date: May 17, 2018

(65) Prior Publication Data
US 2019/0301015 A1    Oct. 3, 2019

Related U.S. Application Data

(60) Provisional application No. 62/420,596, filed on Nov. 11, 2016.

(51) Int. Cl.
*C23C 16/455* (2006.01)
*C23C 16/40* (2006.01)
*C23C 16/44* (2006.01)
*B81B 3/00* (2006.01)
*C04B 28/06* (2006.01)
(Continued)

(52) U.S. Cl.
CPC .......... *C23C 16/45531* (2013.01); *B81B 3/00* (2013.01); *B81B 3/0075* (2013.01); *C04B 28/06* (2013.01); *C23C 16/401* (2013.01); *C23C 16/402* (2013.01); *C23C 16/403* (2013.01); *C23C 16/4417* (2013.01); *C23C 16/45555* (2013.01); *B32B 1/08* (2013.01); *C04B 2111/00551* (2013.01); *C04B 2235/3231* (2013.01); *Y10T 428/265* (2015.01)

(58) Field of Classification Search
CPC B32B 1/08; B81B 3/00; B81B 3/0075; C04B 2111/00551; C04B 2235/3231; C04B 28/06; C23C 16/401; C23C 16/402; C23C 16/403; C23C 16/4417; C23C 16/45531; C23C 16/45555; Y10T 428/265
See application file for complete search history.

(56) References Cited

U.S. PATENT DOCUMENTS

| | | |
|---|---|---|
| 6,054,762 A | 4/2000 | Sakuraba et al. |
| 2003/0015764 A1 | 1/2003 | Raaijiakers et al. |
| 2004/0121073 A1 | 6/2004 | George et al. |

(Continued)

OTHER PUBLICATIONS

ISR dated Jan. 26, 2018 for PCT/US17/61021, 2 pgs.
Written Opinion dated Jan. 26, 2018 for PCT/US17/61021, 5 pgs.

*Primary Examiner* — Yan Lan
(74) *Attorney, Agent, or Firm* — Snell & Wilmer L.L.P.

(57) ABSTRACT

The present invention relates, in part, to a discovery of a method for using atomic layer deposition (ALD) to improve the stability of refractory materials in high temperature steam, and compositions produced by the method.

19 Claims, 6 Drawing Sheets

(51) Int. Cl.
  *C04B 111/00*   (2006.01)
  *B32B 1/08*   (2006.01)

(56) References Cited

U.S. PATENT DOCUMENTS

| | | |
|---|---|---|
| 2007/0287261 A1 | 12/2007 | Raaijmakers et al. |
| 2012/0201860 A1 | 8/2012 | Weimer et al. |
| 2015/0314941 A1 | 11/2015 | Ramadas et al. |

STABILITY OF REFRACTORY MATERIALS IN HIGH TEMPERATURE STEAM

RELATED APPLICATIONS

This application claims priority the Provisional Patent Application No. 62/420,596 filed on 11 Nov. 2016, the teachings of which are incorporated herein by reference in their entireties.

GOVERNMENT SUPPORT

This invention was made in part with Government support under contract DOE Grant No. DE-EE0006671, The Government has certain rights in the invention.

BACKGROUND

Cracking, slag, corrosion, and oxidation are common failure mechanisms for high temperature materials. Ceramic refractory materials are often used in high temperature and chemically hostile environments. Silicon-based ceramics, such as, e.g SiC and $Si_3N_4$ composites, have been used as high-temperature structural materials for chemical reactors and heat exchangers. At high temperatures in the presence of water vapor, SiC will oxidize and degrade, so there is often a need to utilize an environmentally resistant coating over the protective silica scale. Mullite or porcelainite is a rare silicate mineral that can exist as two stoichiometric forms, $3Al_2O_3 2SiO_2$ or $2Al_2O_3 SiO_2$. Chemical Vapor Deposition (CVD) has been used to form a mullite coating or a mullite-alumina coating over the silica scale to protect it from degradation by high temperature steam.

However, at least one problem associated with a mullite-alumina coating formed by CVD is that the coating formed by CVD is porous. The porosity of the coating formed by CVD allows high temperature steam to get into the pores and react with the SiC or $Si_3N_4$, thereby oxidizing and degrading the ceramic.

BRIEF SUMMARY OF THE DISCLOSURE

The present invention relates, in part, to a discovery of a method for using atomic layer deposition (ALD) to improve the stability of refractory materials in high temperature steam, and compositions produced by the method. The disclosed method and compositions provide unexpected advantages. The invention inter ilia includes the following, alone or in combination. In accordance with the present invention there is provided a method wherein ALD is used to deposit alumina ALD films, mullite ALD films, and/or hybrid mullite-alumina films as conformal coatings with no pores or micro-cracks created during deposition on silicon-based ceramics. The disclosed process for using ALD is a desirable and highly controllable method to deposit these films. Au) generates very conformal thin films that are chemically bonded to the substrate surface, making delamination of the film unlikely. The growth of these films are self-limiting by nature which allows for significant control over the final thickness and stoichiometry of the film. This disclosure represents the first achieved example of ALD deposited mullite coatings.

Disclosed herein is a conformal film less than 15 nanometers thick on a surface of a ceramic substrate, the conformal film comprising alumina and silicon dioxide in an approximate ratio of $3Al_2O_3$ to $2 SiO_2$. In one embodiment of the invention, the conformal film has a thickness of from about one nanometer to about 4 nanometers. The ceramic substrate may comprise, for example, carbide, SiC, or zirconia, $ZrO_2$. In contrast to coatings of mullite produced by prior art CND methods, the $3Al_2O_3 2SiO_2$ film disclosed herein in one embodiment is produced by Atomic Layer Deposition, and is conformal and non-porous or substantially pinhole free. Therefore, the herein disclosed conformal films are configured to be used as an environmental harrier to protect the ceramic substrate from oxidation, for example, when exposed to high temperature steam. An example of a conformal film disclosed herein is a conformal film of silicon dioxide formed by ALD as an inter-layer positioned between two thin layers of alumina deposited by ALD.

In one embodiment of the invention, the conformal film is formed by atomic layer deposition using approximately one cycle of alumina for every 2 cycles of silicon dioxide. The disclosed conformal film can cover a ceramic substrate comprising a particle, and wherein the conformal film encapsulates the particle as a uniform coating. In another embodiment, the ceramic substrate comprises a particle, and the conformal film encapsulates the particle as a plurality of well-distributed islands of conformal film across the surface of the ceramic particle. Non-limiting examples of a suitable ceramic substrate for use in an embodiment of the invention include silicon carbide, SiC, Zirconia, $ZrO_2$, aluminum carbide $Al_4C_3$, boron carbide, $B_4C$, aluminum nitride AlN, silicon nitride, $Si_3N_4$, and born nitride, BN.

BRIEF DESCRIPTION OF THE DRAWINGS

Embodiments of the invention are further described hereinafter with reference to the accompanying drawings, in which.

DETAILED DESCRIPTION

Figure 1:
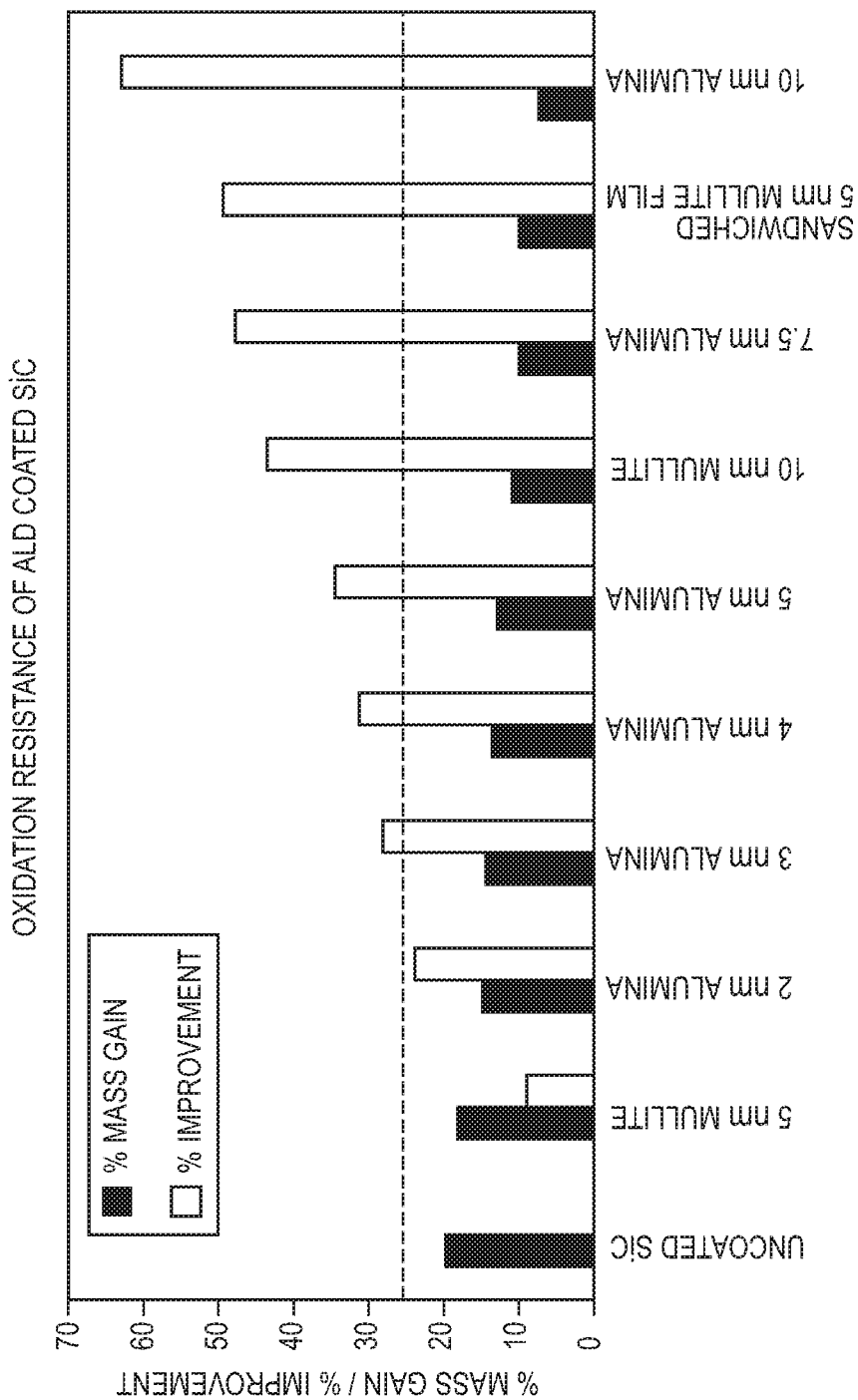
FIG. 1 is a graphical representation of the improvement in oxidation resistance of nine different ALD-film coatings versus uncoated SiC.

It will be understood that the particular embodiments of the invention are shown by way of illustration and not as limitations of the invention. At the outset, the invention is described in its broadest overall aspects, with a more detailed description following.

Disclosed herein are thin film barriers covering the surfaces of sintered high temperature ceramic parts to improve oxidation; corrosion resistance of the ceramic parts to high temperature steam. We developed the thin film barriers using Atomic Layer Deposition (ALD), using particle substrates as a test case. ALD coatings are dense and can be crystalized using a high temperature anneal. These coatings also allow the use of minimal amounts of precursor to generate conformal coatings with no pores or micro-cracks created during deposition. Because ALD involves surface-limited reactions and chemically reactive sites on the substrate, it deposits films that are uniformly chemically bonded to the substrate, and thus are less likely to de-bond from thermal cycling.

Atomic Layer Deposition (ALD), a thin film deposition technique, is a self-limiting surface reaction that deposits uniform layers of the desired precursor onto the particles surface. This is done by fluidizing the particles and adding two different precursors in sequence such that there are two reactions occurring. In ALD, the addition of $Al_2O_3$ to the reaction typically utilizes trimethylaluminium (TMA) and water as precursors, adding first TMA, then water, then TMA, and so on. One addition of TMA plus one addition of water comprises one cycle. The reaction proceeds in a fluidized bed reactor to help ensure coating of all surfaces, Dimethylaluminum. (DMA) can also be used.

The film can be engineered to have desired thickness, composition, and crystal structure. Mullite, an aluminosilicate material that can take on a variety of phase compositions based on stoichiometry, was deposited via ALD) with the desired crystal structure and stoichiometry. Mullite is a stoichiometric combination of alumina and silica that forms a unique phase. We focused on 3:2 mullite ($3Al_2O_3:2\ SiO_2$), because it is the most stable mullite phase. With no more than routine experimentation, using the ALD methodology disclosed herein, one could also produce a conformal thin film comprising other stoichiometric combinations of alumina and silica, e.g., $2Al_2O_3:1\ SiO_2$. As described below, from our analysis, we concluded that 1 cycle alumina to 2 cycles silica is the ideal cycle deposition ratio for producing 3:2 mullite ($3\ Al_2O_3:2\ SiO_2$). However, other cycle ratios studied produced films with a range of compositions such as, $1\ Al_2O_3:1\ SiO_2$ with a 1 cycle alumina to 3 cycles silica ratio; and $13\ Al_2O_3:1\ SiO_2$ with a 1 cycle alumina to 1 cycle silica ratio. These results indicate that the film composition can be tuned to very specific ratios by controlling only the cycle ratio of the two chemistries during deposition. Varying the cycle ratios would be expected to produce other useful files.

The protective properties of the films were analyzed using thermogravimetric analysis, ALD coated particles were exposed to high temperature steam while mass gain/loss associated with reaction was monitored. The stabilization of SiC was modeled to predict performance of target materials and identify other promising materials. Oxidation and corrosion were modeled with Density Functional Theory (DFT) to determine the energy barriers required to make these reactions significant at high temperature (>1000° C.). This modeling has identified boron nitride as another promising barrier material that could be deposited via ALD.

We sought to produce coated SiC containment materials that provide for at least a 25% reduction in the reactivity with 30 vol % steam as compared to pure SiC at 500° C.

Protocol and Results

A thin, dense, crystalline mullite coating was deposited on zirconia and silicon carbide particles pia a novel approach using atomic layer deposition (ALD). The compositions of the films were confirmed with inductively coupled plasma optical emission spectroscopy (ICP), and the conformity and elemental dispersion of the films were characterized with transmission electron micropscopy (TEM) and energy dispersive X-ray spectroscopy (EDS), respectively. The deposited films were shown to conformally adhere to the particle surface with a thickness consistent with a deposition rate of approximately one angstrom per cycle (1 Å/cycle). The elemental amount of aluminum relative to silicon in the film was determined to be 2.68:1, which agrees closely with the ratio of stable 3:2 mullite (2.88:1). A hirth-temperature anneal done at 1500° C. for 5 hours was used to crystalize the films, and X-ray diffraction (XRD) confirmed the formation of a mullite phase. This represents the first achieved example of ALD deposited mullite coatings.

Summary of Experimental Results

FIG. 1 shows the improvement in oxidation resistance of nine different ALD-film coatings versus that of uncoated SiC. Seven out of the nine coatings tested exceeded the Department of Energy (DOE) target of a 25% improvement.

Oxidation resistance was quantified by measuring the mass gain of materials under high-temperature steam conditions in a thermo-gravimetric analyzer. Although we originally tested the coatings at 500° C., we found that testing at 1000° C. produced clearer results, that is, less noise, and would better represent the true water-splitting environment. Uncoated and coated SiC particles were exposed to high temperature steam at 1000° C. for 20 hours with an evaporation rate of 3 g/hour. All samples exhibited a mass gain, which we attribute to the growth of silicon dioxide on the particle surface.

Many films that were tested; and the best performing film was a 10 nm alumina film. Further, due to trends noted in the data, we believe that the most promising film composition comprises alternating layers of mullite and alumina ALD Research on the ideal conditions for particle Solar Thermal Water Splitting (STWS) systems indicates that very high process temperatures are required to produce meaningful quantities of hydrogen. This necessitates the use of ceramic reactor materials, as no reasonably-priced metallic materials can withstand temperatures above 1350° C. Silicon carbide seems to be the most promising material identified thus far. However, silicon carbide degrades under oxidizing environments to form silicon dioxide, which diminishes the structural and thermal integrity of the material.

To address this problem, we investigated the use of thin films on the surface of SiC particles to slow the oxidation process. We tested the performance of films of alumina, mullite and boron nitride in preventing oxidation of the underlying ceramic.

The performance of ALD coated SiC in a high temperature steam environment was analyzed using thermogravimetric analysis (TGA). A NETSZCH STA 449 F1 Jupiter instrument with an attached water vapor generator was used to produce the humid environment. Uncoated SiC particles and ALD coated SiC carbide particles were exposed to high temperature steam at 1000° C. for 20 hours. Water vapor was introduced to the sample chamber once the temperature had reached 1000° C. In all of these experiments mass loss/gain of the sample was monitored over the course of the steam exposure. Mass gain during these experiments is attributed to silica growth on the surface due to oxidation.

Figure 2A:
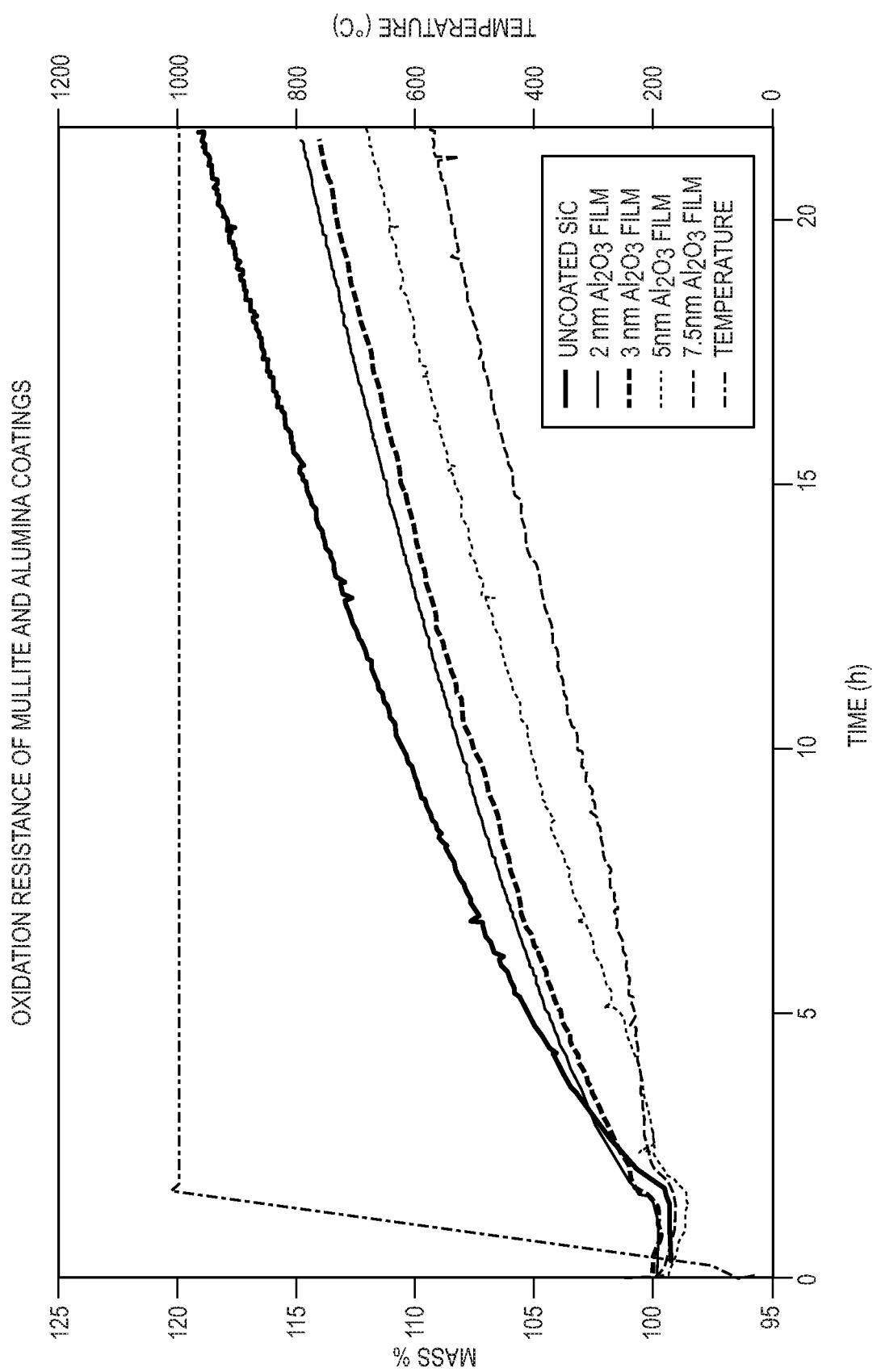
FIG. 2A is a graphical representation of the oxidation resistance of alumina film coating of different thickness at increasing temperature versus uncoated SiC.
Figure 2B:
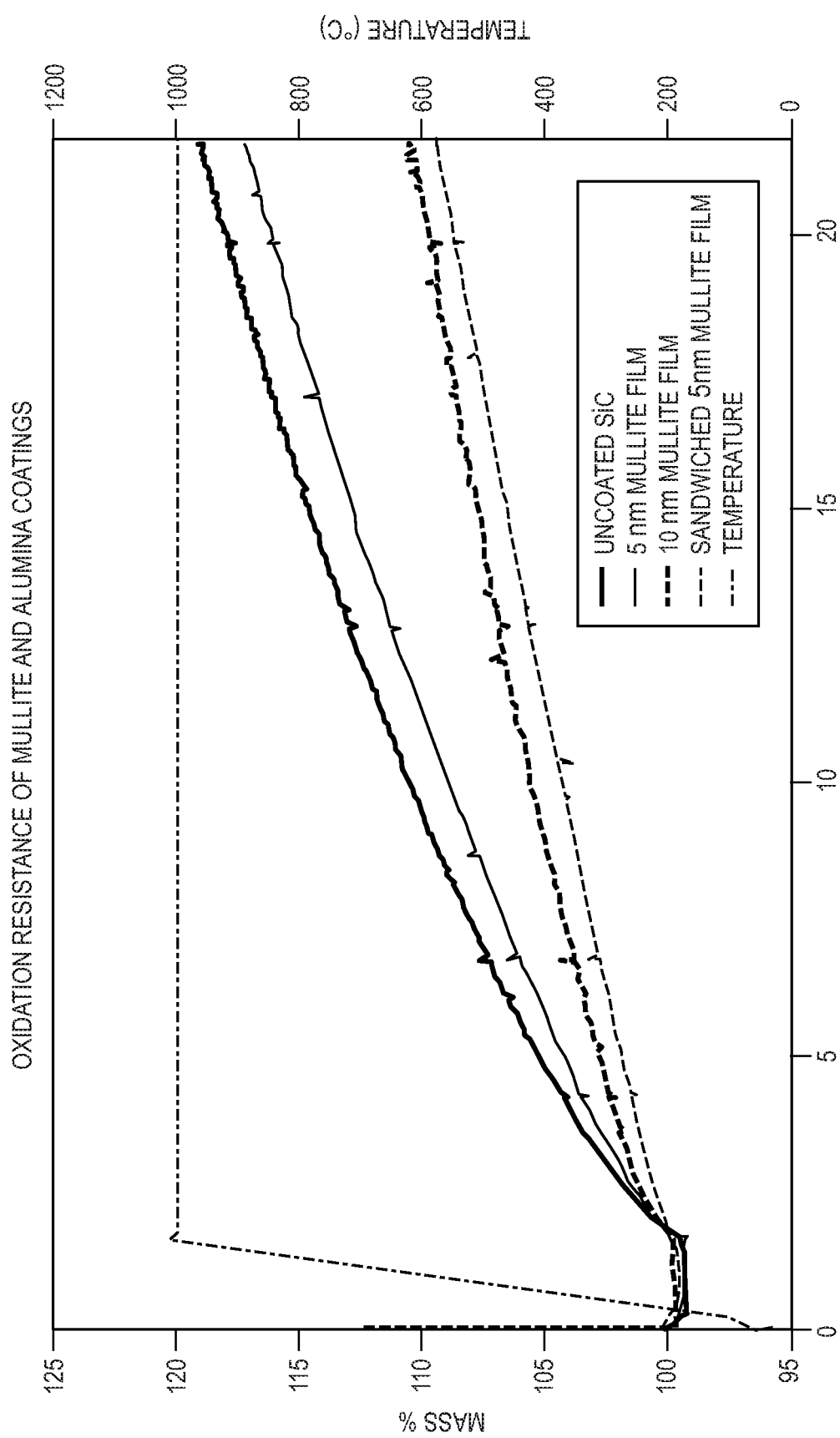
FIG. 2B is a graphical representation of the oxidation resistance of mullite film coating of different thickness at increasing temperature versus uncoated SiC and sandwiched mullite and alumina film.

The results in FIG. 2A and FIG. 2B show that the thickness of the film will improve oxidation resistance of the underlying SiC as the film is grown thicker. It is expected that there is an ideal thickness wherein thicker films no longer impact the oxidation resistance. Mullite ALD films are expected to have more desirable mechanical properties over long term exposure. Therefore, in short term tests it is expected that mullite will not be exactly comparable to alumina in terms of oxidation resistance. By coupling mullite films with alumina films, the performance of the best performing alumina film was achieved.

The results of our recent TGA studies affirm that significant improvements can be obtained by applying thin films of alumina and mullite. The best performing coating to date shows a 64% improvement over uncoated SiC. The performance of mullite has matched the performance of alumina, allowing the films to benefit from the ideal thermal properties of mullite without sacrificing performance.

FIG. 2A shows the mass lass/gain curves of alumina ALD films varying from 2 nm to 7.5 nm thick, and that of uncoated SiC. FIG. 2B shows the mass loss/gain curves of mullite ALD) and hybrid mullite/alumina film. These results encourage us to continue to study the use of ALD coatings to improve the oxidation resistance of ceramics suited for use STWS reactors and high-temperature heat exchangers. Further work will be focused on improving these films and applying them to SiC tubes.

Modeling the structure of Mullite: Mullite is a stoichiometric combination of alumina and silica that forms a unique phase. We focused on the most stable mullite phase, 3:2 mullite (3 $Al_2O_3$:2 $SiO_2$). Mullite forms a quasi-orthorhombic crystal structure due to the location of vacancies in the lattice that cause the crystal structure to distort away from the perfect orthorhombic structure.

There are seven distinct types of sites in a mullite unit cell and four of those sites are partially occupied. This partial occupancy has been thoroughly established. However, the fundamental understanding of how these random vacancies effect material properties such as thermal stability and diffusivity would be important in developing strategies for designing materials with superior harrier properties.

The largest challenge associated with performing quantum chemical calculations for materials like mullite is the partial occupancy of lattice sites. Because these types of calculations cannot be performed with partial atoms or with atoms occupying the same sites, we must expand the unit cell used for the calculations to allow for enough lattice sites that can account for the probability of occupancy. The smallest computational cell that preserves the stoichiometry of 3:2 mullite has 192 atomic sites wherein over 50% of them are randomly partially occupied. In order to generate structures that are truly randomly occupied, we have developed a generalized Monte-Carlo approach for filling the lattice locations and determining where vacancies have occurred. Each structure is generated based on the probability of occupancy for the type of lattice site. Once the structure is assembled, it is screened for the correct stoichiometry and overlapping atoms. Using this approach for generating computational cells allows us to be able to examine a range of structural characteristics that can statistically occur based on occupancy probabilities.

The Monte-Carlo script was used to generate 300 unique structures which were all relaxed using DFT. The initial relaxation was performed with a gamma point calculation and then the final energy was extracted with a single point energy calculation with a 3×3×3 point expansion. Energy cutoff and k-point expansion studies were performed on a representative structure to ensure that the calculation settings and the computational approach gave accurate and converged results. The range in energies of the 300 cells examined was approximately 24 eV, which indicates that there are certain structural characteristics that result in very high energy structures. In order to extract what those characteristics are, 5 factors were identified to examine using a general linear model fit and ANOVA. This statistical approach allows unimportant factors to be screened out until only statistically significant results remain. The effects of broken Si—O bonds, broken Al—O bonds, over-coordination of Al and Si, and the clustering of Si within the lattice were considered. The statistics show that the number of broken Si—O bonds and Si-clustering impact whether or not the cell is a high energy structure. The impact of Si—O bonds is larger due to the tetrahedral bonding nature of the aluminum and silicon atoms. Because it has only 3 valence electrons, aluminum must form a dative bond with oxygen in order to occupy a tetrahedral site. Because Si has 4 valence electrons, when the Si—O bond is broken, it forms a Si radical and has a much higher energy penalty than does breaking the dative bond on the tetrahedral aluminum.

Predicting the Performance of Barrier Materials: Many nitride materials possess desirable thermal properties for these applications. Silicon nitride, $Si_3N_4$, is not thermally stable above 1850° C., but it is a candidate for ALD encapsulation with a conformal film comprising alumina and/or silicon dioxide. Initial calculations were focused on aluminum nitride (AlN) and boron nitride (BN) along with mullite and alumina. Both of these nitride materials can be deposited using an embodiment of our method of ALD. AlN is a promising candidate materials due to its high temperature stability, high theoretical thermal conductivity, and its similar crystal structure to SiC. However, AlN reacts with water to form ammonia, and therefore the use of AlN as a barrier would motivate the need for a multi-layer barrier. BN also has ideal thermal stability and thermal conductivity for our applications, and when exposed to oxidative environments at high temperatures forms a glassy oxide layer that is self-limited and would prevent further oxidation from occurring. BN forms a cubic crystal structure in the desired operating range of 1000 to 1500° C. This structure is not a perfect match to the wurtzite phase of SiC, and therefore may introduce some mechanical weakness in the coating. There is also the potential to intercalate water molecules between crystal layers of BN at these temperatures.

Figure 3:
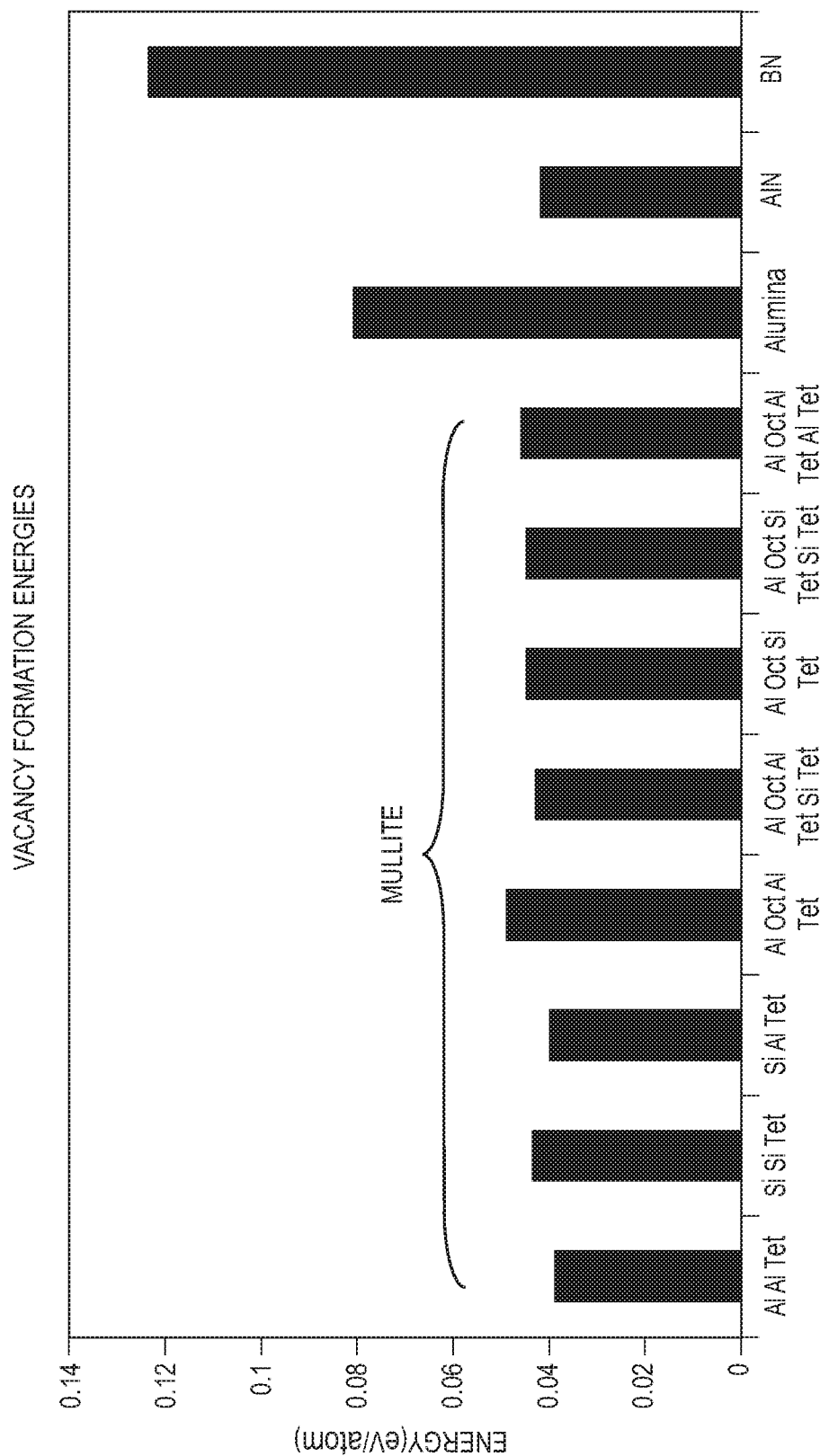
FIG. 3 is a bar graph representing vacancy formation energies for candidate barrier materials.

The modeling of coating stability includes oxygen vacancy formation, and ion diffusion through the material lattice. Diffusion of oxygen through most metal oxides is known to occur a vacancy mediated mechanism. This type of diffusion requires the generation of new oxygen vacancies within the lattice, and then the migration of oxygen atoms through those vacancies during diffusion. Determining if oxygen diffusion is likely to be significant at high temperatures requires calculation of oxygen vacancy formation energies as well as oxygen hopping energy barriers. Vacancy formation energies were calculated for mullite (8 unique oxygen environments), alumina, AlN, and BN. These vacancy formation energies are tabulated in FIG. 3. A high vacancy formation energy is ideal for stabilization of high temperature ceramics because this would contribute to slowing the diffusion of oxygen to the underlying material.

To calculate a barrier for the hopping event in the lattice transition state, searching methods are used. These methods will generate the appropriate structures to model a reaction and search for the minimum energy pathway. These methods can be used to find the energy barrier of a hopping event in diffusion by modeling the movement of the atom through the lattice in a user-set amount of steps. These calculations have been implemented to determine the energy barrier for oxygen diffusion through the four (4) candidate materials. For mullite and alumina, the calculations modeled a simple vacancy/oxygen switch in the lattice. For the nitride materials, an oxygen filling a nitrogen vacancy was first modeled, followed by an ion exchange reaction between the oxygen and nitrogen atoms in the lattice.

A direct comparison of the oxygen hopping energies for candidate barrier materials to each other, and also a general energy value that would characterize an active reaction for our temperature range, allowed us to determine what materials were the most promising.

As stated above, previous experimental studies used Chemical Vapor Deposition (CVD) and plasma-spraying) deposit mullite layers onto SiC, With CVD-deposited mullite, the majority of the layers contained a large amount of pores and micro-cracks, yet the coating was still protective due to a thin dense layer of mullite at its interface with the SiC substrate. However, failure of the prior art coatings has been observed. The failure of the CVD coatings was due to de-bonding from the substrate, probably caused by thermal shock associated with removing the samples to ambient conditions with no controlled cool down.

Depositing mullite with ALD according to our disclosed methods will produce films with all the positive characteristics determined by this previous experimental work. Importantly, ALD coatings will be dense and can be crystalized using a high temperature anneal. These coatings will also allow the use of minimal amounts of precursor to generate conformal coatings with no pores or micro-cracks generated during deposition. Because ALD involves surface-limited reactions and chemically reactive sites on the substrate, it deposits films that are uniformly chemically bonded to the substrate and thus less likely to de-bond from thermal cycling.

A goal of our work was to deposit mullite thin conformal films by ALD that will provide ideal characteristics for environmental barriers. We discovered that the use of ALD allowed us to deposit thin, conformal coatings with inherent control of the stoichiometry of the final film by controlling the number of cycles of alumina and silica. This control allowed enough tenability to generate films with the most stable phase of mullite, $3Al_2O_3:2SiO_2$. In one embodiment of the disclosed film, the ratio of aluminum atoms to silicon atoms is approximately 3 aluminum atoms to 1 silicon atom.

Research Methods: Zirconia and silicon carbide particles were coated in a vibrating fluidized bed reactor. The system consisted of a gas delivery system controlled by LabView™, a reactor tube heated in a vertical furnace, a vibration generation system, a DAQ interfaced with LabView™ and in-situ mass spectrometry. The vibration generator was used to overcome inter-particle forces and improve fluidization. High purity nitrogen gas, controlled by a mass flow controller, was used to purge away unreacted precursors. A Baratron capacitance manometer was installed at the exit of the reaction zone to monitor the dosing pressure. A quadrupole mass spectrometer (Stanford Research Systems was connected to the outlet of the reactor to monitor the progress of each half-reaction.

Zirconia nano-particles were obtained from US Research Nanomaterials (Houston, Tex.). These particles have an average particle size of 40 nm and a specific surface area of 11.9 m²/g. Silicon carbide α-phase particles were obtained from Alfa Aesar (Chicago, Ill.). These particles have a reported size of 2 μm, and a specific surface area of 10 m²/g.

The ALD reactor was encased in a clamshell furnace at 300° C. and the gas delivery lines were kept at approximately 100° C. A deposition temperature of 300° C. was used to stay within the ALD window for both chemistries and avoid thermal cycling of the reactor during deposition. TMA and TDMAS were procured from Sigma Aldrich (St. Louis, Mo.) and dosed from SurePak™ bottles. DI water and hydrogen peroxide (Macron Fine Chemicals) were dosed from stainless steel sample cylinders. Hydrogen peroxide 30% was diluted by half in deionized water. A dosing pressure of 2 torr for each precursor was used, resulting in exposure times of 2 minutes for TMA, 1 minute for TDMAS and 3 minutes for water and $H_2O_2$. The resulting coated particles were annealed for 5 hours at 1500° C. under inert flow.

Based on the surface reactions taking place during each dose, the reaction can be monitored with mass spectrometry. The extent of reaction can be monitored by observing the increase of byproducts in the effluent stream. The surface is saturated and the self-limiting reaction complete when breakthrough of the precursor molecule is observed. Methane, dimethyl aluminum, dimethylamine, $H_2O_2$, and water were tracked to monitor mullite deposition.

Inductively coupled plasma optical emission spectrometry (ICP-OES) (Thermo Scientific ARL 3410+) was used to determine the deposition rate of each chemistry and calculate the stoichiometry of the resulting layer. Transmission electron microscopy (FBI Tecnai Spirit BioTwin) and scanning electron microscopy/energy dispersive spectroscopy (JEOL JSM-6480LV with EDS) were used to image the resulting films and determine elemental dispersion of the films. X-ray diffraction (Bruker D2 Phaser) and BET analysis (Micromeretics Gemini V) were used to analyze crystallinity and loss of surface area caused by high temperature anneal. The particles were ramped to 1500° C. and held for 5 hours under inert in a CM tube furnace to crystalize the coatings.

Mullite ALD had not been developed prior to our work, disclosed herein. Our approach was to break down the deposition into layers of alumina and silica deposited in such a way as to achieve the desired stoichiometry. Trimethyl aluminum/water was used to deposit alumina; and tris (dimethylamino)silane/hydrogen peroxide was used to deposit oxide layers. The layering of the alumina and silica to create mullite was accomplished via 4 separate self-limiting ALD) half-reactions (ABCD) performed cyclically. These reactions occur on OH* reactive sites inherent to the substrate surface. The half reactions summarized below are valid for steady state deposition after initial nucleation of ALD.

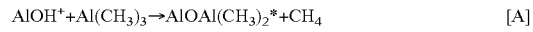

AlOH⁺+Al(CH₃)₃→AlOAl(CH₃)₂*+CH₄         [A]

AlCH₃*+H₂O→AlOH*+CH₄         [B]

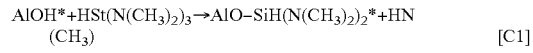

AlOH*+HSt(N(CH₃)₂)₃→AlO–SiH(N(CH₃)₂)₂*+HN(CH₃)         [C1]

AlO–SiH(N(CH₃)₂)₂*→AlO–SiH(N=CH₂)*+CH₄         [C2]

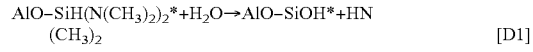

AlO–SiH(N(CH₃)₂)₂*+H₂O→AlO–SiOH*+HN(CH₃)₂         [D1]

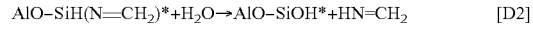

AlO–SiH(N=CH₂)*+H₂O→AlO–SiOH*+HN=CH₂         [D2]

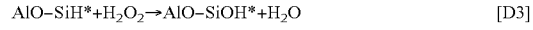

AlO–SiH*+H₂O₂→AlO–SiOH*+H₂O         [D3]

Initial deposition studies were carried out on a zirconia substrate to facilitate the use of ICP and EDS to characterize the aluminum and silicon presence in the ALD coating. The dissolution of the entire sample needed for ICP and the penetration depth of EDS would make both of these methods unable to distinguish film from bulk. Zirconia was used because it does not contain either aluminum or silicon in significant amounts, and has a significant concentration of surface OH* species to facilitate the use of these ALD chemistries.

Mass spectrometry was used to monitor the progress of each half reaction, Dimethyl aluminum is the most common form of TMA after the mass spectrometer ionizer due to fracturing of the molecule, and as such, the strongest signal to track during the reactions. When TMA is reacting with the substrate surface the byproduct expected is methane (reaction A). The extent of the half reaction can be tracked by the increase of methane. The reaction is complete when there are no longer reactive sites on the surface that TMA can reach. This event correlates with a breakthrough of the TMA molecule. The same methane byproduct is observed during the second half reaction (reaction B), and breakthrough of water would indicate completion of the second half reaction. These trends can clearly be seen in the mass spectroscopy trace associated with $TMA/H_2O$ cycles.

For the silica chemistry, the byproduct of the reaction (dimethyl amine) is also the strongest signal observed for TDMAS since large molecules tend to fracture in the ionizer. An initial increase in dimethyl amine indicates the surface reaction (reaction C) is proceeding. A subsequent decrease and then leveling of the dimethyl amine signal indicates the reaction is complete and the precursor is the only source of the fragment.

Clear water breakthrough correlated with the completion of the second half reaction (reaction D).

Three different cycle ratios were explored in an attempt to control the stoichiometry of the resulting film to match that of 3:2 mullite. Based on deposition rates for each chemistry, the ideal ratio was proposed to be 1 cycle alumina to 3 cycles silica to produce the ideal alumina to silicon ratio for 3:2 mullite. However, this ratio was shown to deposit more silica than what is needed for the 3:2 stoichiometry. To adjust the stoichiometry cycle, ratios of 1 cycle alumina to 1 cycle silica, and 1 cycle alumina to 2 cycles silica were used, and analyzed with ICP. From the analysis, we concluded that 1 cycle alumina to 2 cycles silica is the ideal deposition ratio.

Figure 4A:
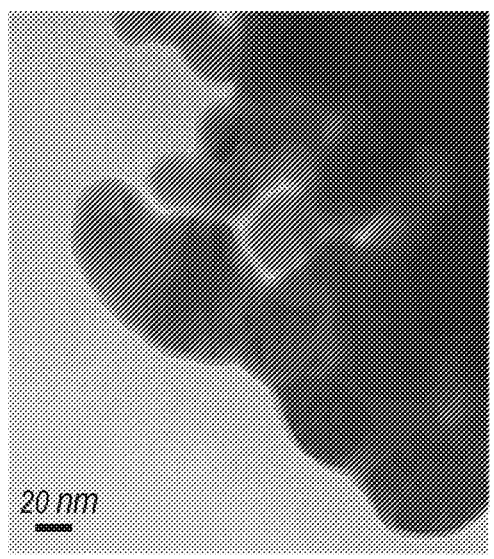
FIG. 4A shows TEM Images of 51 cycles mullite ALD on $ZrO_2$ nanoparticles.
Figure 4B:
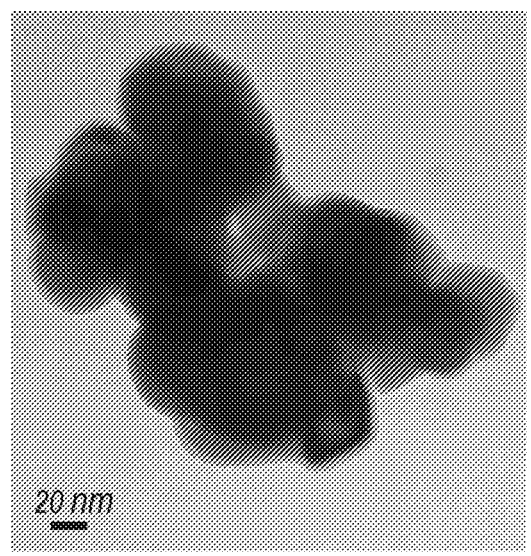
FIG. 4B also shows TEM images of 51 cycles mullite ALD on $ZrO_2$ nanoparticles.

EDS and TEM were used to characterize the dispersity and conformity of the deposited mullite. EDS showed that the alumina and silica were both well-dispersed over the entire particle indicating that the films were uniform in composition across the particle surface. Using TEM we were able to visualize the ALD layers separate from the underlying zirconia particle, as shown in FIG. 4A and FIG. 4B. FIG. 4A shows TEM Images of 51 cycles mullite ALD on $ZrO_2$ nanoparticles. FIG. 4B also shows TEM Images of 51 cycles mullite ALD on $ZrO_2$ nanoparticles. The films were deposited in a conformal layer and appeared to have thicknesses of approximately 5 nm, correlating well to the expected deposition rate of approximately one angstrom per cycle (1 Å/cycle).

To explore the effects of a high temperature anneal on the crystalline phase of the coating, mullite. ALD was repeated on SiC particles. It is known that a ZrSiO4 phase will form at high temperatures when zirconia and silica are present in the material, and prevent the formation of a mullite phase. SiC particles were chosen because the mullite/SiC system may be a way to stabilize SiC in oxidative environments. A 10 nm film of mullite ALD was deposited on these particles and annealed at 1500° C. in order to crystalize the film. SEM micrographs showed the formation of mullite whiskers after the anneal, indicating that the film was crystalizing into a mullite phase.

Figure 5:
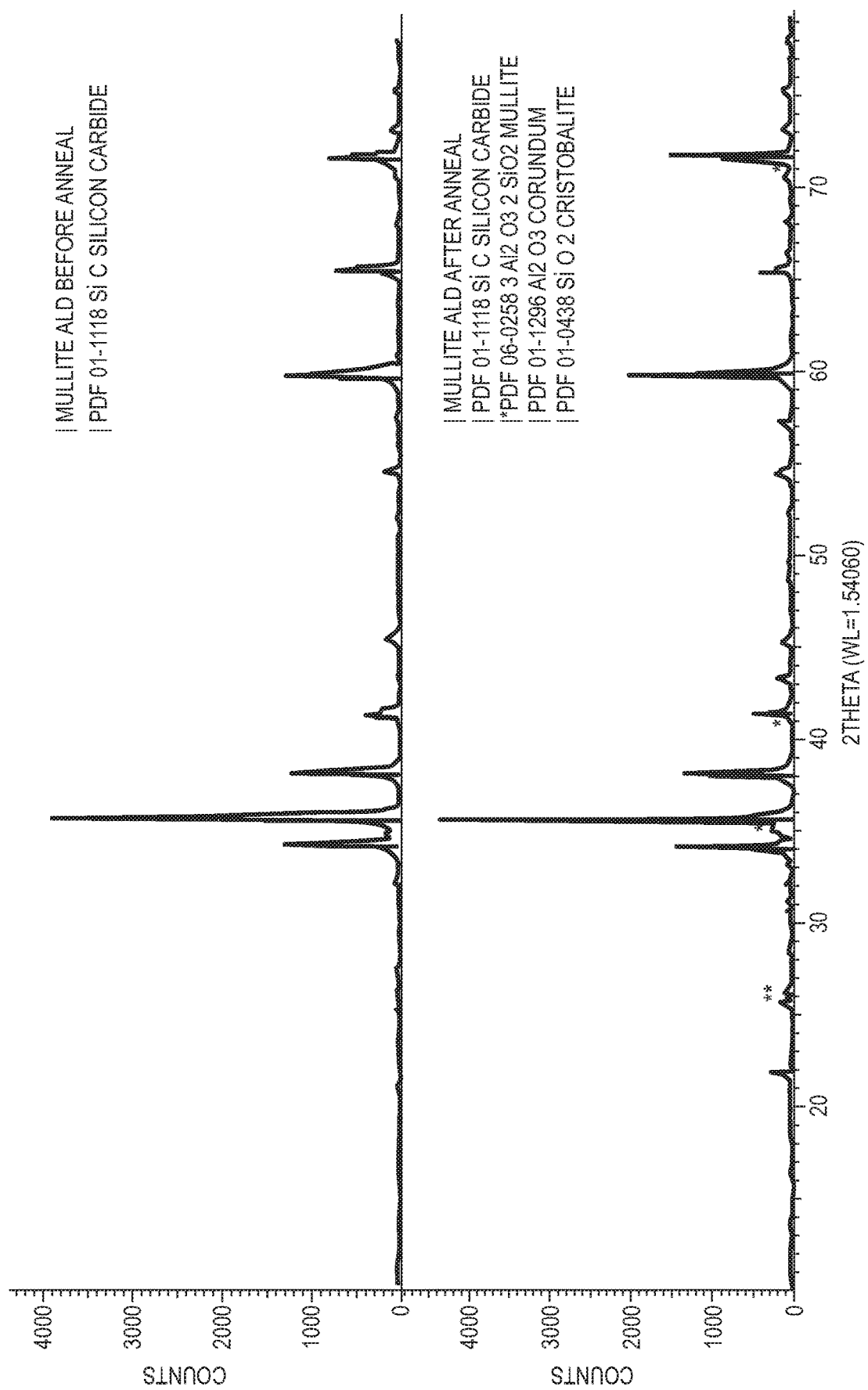
FIG. 5 shows X-ray diffraction spectra for 100 cycles mullite ALB on SIC particles before anneal (top) and after anneal (bottom).

X-ray diffraction spectra for 100 cycles of mullite ALD on SiC particles (FIG. 5) was used to confirm the formation of a distinct mullite phase. The XRD spectra of the particles before anneal (FIG. 5 top), shows peaks only for the SiC substrate. After annealing (FIG. 5 bottom), there are visible peaks that correspond to the formation of crystalline phases. Specifically, there are strong indicators that mullite has formed, but peaks for silica and alumina are also present.

BET analysis was used to determine changes in the specific surface rea of the particles after deposition and after high temperature anneal. The particles appeared to have a small decrease in surface area after the film was deposited. This is most likely due to ALD encapsulating silica clusters generated during normal oxidation of SiC in air. After annealing, the specific surface area was reduced by approximately 50%. This larger change can be attributed to the densification of the film during crystallization.

Non-limiting examples of other embodiments of the invention include: a ceramic substrate comprising a silicon carbide component coated with the conformal film comprising alumina and silicon dioxide; a ceramic substrate comprising a silicon carbide tube coated on at least one of the inside and the outside surfaces of the tube with the conformal film comprising alumina and silicon dioxide; a silicon carbide tube coated on the inside surface of the tube with the conformal film comprising alumina and silicon dioxide; a silicon carbide heat exchanger tube and a microchannel device each formed of silicon carbide and conformally coated on at least one surface with a film comprising alumina and silicon dioxide deposited by ALD according to the disclosed methods.

The disclosed mullite ALD films can potentially be used to enhance nuclear reactor safety. Tristructural-isotropic fuel particles are triple-coated spherical or pellet-shaped particles of uranium fuel, less than about one millimeter in diameter. To contain the nuclear fuel, the tiny uranium center is coated by a layer of carbon, which is coated by silicon carbide, covered by an outer shell of carbon. The particles are then fabricated into fuel pellets. The triple layer coating helps protect nuclear fuel at and above the high temperatures which may occur in a reactor melt-down, Another promising use for an ALD conformal thin film comprising alumina and silicon dioxide according to our disclosure, is on the SiC layer surrounding or encapsulating a uranium fuel pellet, wherein the SiC layer comprises an inner surface and an outer surface and is coated with the conformal film on at least one of the inner surface and the outer surface. The reaction of steam with SiC can potentially deteriorate the fuel pellets. An ALD mullite coating may help to reduce oxidation of the SiC in the fuel pellet with steam.

Conclusions: Based on our results and analysis, it can be concluded that thin conformal mullite films were generated on the surface of particles via a novel ALD method with highly controllable stoichiometry. Films were generated at thicknesses of 5 and 10 nm, however the use of ALD allowed for the desired thickness to be easily controlled. These films were confirmed, by EDS, to be evenly dispersed over the surface of the particle, and the formation of a mullite phase was visible with XRD after heat treatment at 1500° C. The films appeared to be intact after high temperature exposure with small amounts of mullite whiskers forming, and, due to the densification of the film, a significant reduction of specific surface area.

Features, integers, characteristics, compounds, chemical moieties or groups described in conjunction with a particular aspect, embodiment or example of the invention are to be understood to be applicable to any other aspect, embodiment or example described herein unless incompatible therewith. All of the features disclosed in this specification (including the accompanying drawings), and/or all of the steps of any method or process so disclosed, may be combined in any combination, except combinations where at least some of such features and/or steps are mutually exclusive. The drawings in the Figures are not necessarily to scale. The invention is not restricted to the details of any foregoing embodiments. The invention extends to any novel one, or any novel combination, of the features disclosed in this specification (including any accompanying drawings), or to any novel one, or any novel combination, of the steps of any method or process so disclosed.

EQUIVALENTS

While this invention has been particularly shown and described with references to preferred embodiments thereof, it will be understood by those skilled in the art that various changes in form and details may be made therein without departing from the scope of the invention,

What is claimed is:

1. An article comprising a ceramic substrate and a crystalline conformal film less than 15 nanometers thick on a surface of the ceramic substrate, the conformal film formed from alumina and silicon dioxide in an approximate ratio of 3 $Al_2O_3$ to 2 $SiO_2$, wherein the conformal film encapsulates the substrate.

2. The article of claim 1, wherein the conformal film has a thickness of from about one nanometer to about 4 nanometers.

3. The article of claim 1, wherein the ratio of aluminum atoms to silicon atoms is approximately 3 aluminum atoms to 1 silicon atom.

4. The article of claim 1, wherein the ceramic substrate comprises silicon carbide, SiC.

5. The article of claim 1, wherein the ceramic substrate comprises zirconia, $ZrO_2$.

6. The article of claim 1, wherein the ceramic substrate comprises aluminum carbide, $Al_4C_3$.

7. The article of claim 1, wherein the ceramic substrate comprises boron carbide, $B_4C$.

8. The article of claim 1, wherein the ceramic substrate is chosen from aluminium nitride, AlN, and silicon nitride, $Si_3N_4$.

9. The article of claim 1, wherein the ceramic substrate comprises boron nitride, BN.

10. The article of claim 1 wherein the conformal film is pinhole free.

11. The article of claim 1 wherein the conformal film comprises mullite.

12. The article of claim 11, wherein the conformal film is configured to be used as an environmental barrier to protect the ceramic substrate from oxidation.

13. The article of claim 1, wherein the ceramic substrate comprises a silicon carbide tube.

14. The article of claim 13, wherein the silicon carbide tube is a heat exchanger tube.

15. The article of claim 1, wherein the ceramic substrate comprises a microchannel device comprising silicon carbide.

16. The article of claim 2, wherein the ceramic substrate comprises a particle and the conformal film encapsulates the particle as a uniform coating.

17. The article of claim 2, wherein the ceramic substrate comprises a particle and the conformal film encapsulates the particle as a plurality of well-distributed islands of conformal film across the surface of the ceramic particle.

18. The article of claim 11, wherein the atomic layer deposition comprises approximately one cycle of alumina for every 2 cycles of silicon dioxide.

19. The article of claim 4, wherein the silicon carbide substrate surrounds or encapsulates a uranium fuel pellet, and the silicon carbide substrate comprises an inner surface and an outer surface and is coated with the conformal film on at least one of the inner surface and the outer surface.

* * * * *